(12) United States Patent
Lehmann et al.

(10) Patent No.: US 10,951,025 B2
(45) Date of Patent: Mar. 16, 2021

(54) HYBRID ENERGY STORAGE SYSTEM

(71) Applicant: RUTRONIK ELEKTRONISCHE BAUELEMENTE GMBH, Ispringen (DE)

(72) Inventors: Ringo Lehmann, Zwckau (DE); Lutz Zacharias, Gornau/Erzgebirge (DE); Mirko Bodach, Oberlungwitz (DE); Sven Slawinski, Auerbach/Vogtland (DE); Andreas Mangler, Karlsruhe (DE); Markus Krieg, Ispringen (DE)

(73) Assignee: RUTRONIK ELEKTRONISCHE BAUELEMENTE GMBH, Ispringen (DE)

( * ) Notice: Subject to any disclaimer, the term of this patent is extended or adjusted under 35 U.S.C. 154(b) by 56 days.

(21) Appl. No.: 16/462,767

(22) PCT Filed: Nov. 18, 2017

(86) PCT No.: PCT/EP2017/079696
§ 371 (c)(1),
(2) Date: May 21, 2019

(87) PCT Pub. No.: WO2018/091697
PCT Pub. Date: May 24, 2018

(65) Prior Publication Data
US 2019/0372343 A1 Dec. 5, 2019

(30) Foreign Application Priority Data

Nov. 21, 2016 (DE) ..................... 10 2016 122 383.2

(51) Int. Cl.
*H02J 1/10* (2006.01)
*H02M 3/158* (2006.01)
(Continued)

(52) U.S. Cl.
CPC ............. *H02J 1/10* (2013.01); *H02M 3/1582* (2013.01); *B60L 58/21* (2019.02); *B60L 2210/12* (2013.01);
(Continued)

(58) Field of Classification Search
CPC ......... H02J 1/10; H02M 3/1582; B60L 58/21; B60L 2210/12; B60L 2210/14;
(Continued)

(56) References Cited

U.S. PATENT DOCUMENTS

2009/0145675 A1* 6/2009 Ichikawa ................ B60L 58/20
  180/65.1
2009/0314558 A1* 12/2009 Ang ........................ B60L 58/21
  180/65.1
(Continued)

FOREIGN PATENT DOCUMENTS

DE 102008021875 A1 10/2009
EP 0744817 A2 11/1996
(Continued)

OTHER PUBLICATIONS

International Search Report for corresponding application PCT/EP2017/079696 filed Nov. 18, 2017; dated Jan. 25, 2018.
(Continued)

*Primary Examiner* — Metasebia T Retebo
(74) *Attorney, Agent, or Firm* — Cantor Colburn LLP (57) ABSTRACT

A hybrid energy storage system includes at least one first energy store and at least a second energy store, each with a nominal energy flow at least in one direction, wherein the energy stores exchange electrical energy with one another and/or with at least one external energy source and/or energy sink via electro-physical energy flows, using at least one control circuit. The control circuit operates the energy sink using at least one boost converter, which has at least one
(Continued)

electronic switch, and/or a buck converter in the event of a required energy flow of the energy sink which is higher than the nominal energy flow of the second energy store, with an energy flow of the first energy store, while the second energy store supplies an energy flow from zero up to a constant energy flow which corresponds at maximum to the nominal energy flow of the second energy store.

13 Claims, 4 Drawing Sheets

(51) Int. Cl.
*B60L 58/21* (2019.01)
*H01M 10/42* (2006.01)

(52) U.S. Cl.
CPC ...... *B60L 2210/14* (2013.01); *H01M 10/4257* (2013.01); *H01M 10/4264* (2013.01); *H01M 2010/4271* (2013.01)

(58) Field of Classification Search
CPC .... B60L 58/20; B60L 3/003; H01M 10/4257; H01M 10/4264; H01M 2010/4271; Y02E 60/10; Y02T 10/70; Y02T 10/72; H03K 2017/307
USPC .......................................................... 307/82
See application file for complete search history.

(56) References Cited

U.S. PATENT DOCUMENTS

| | | |
|---|---|---|
| 2009/0317696 A1 | 12/2009 | Chang |
| 2010/0001583 A1* | 1/2010 | Ichikawa ................ B60L 50/61 307/10.1 |
| 2011/0032733 A1 | 2/2011 | Watanabe |
| 2011/0084648 A1 | 4/2011 | Cao |
| 2011/0272205 A1* | 11/2011 | Fujimoto ................ H02M 1/32 180/446 |
| 2014/0343776 A1* | 11/2014 | Ang ........................ B60L 58/18 701/22 |
| 2014/0354058 A1* | 12/2014 | Guo ...................... H02M 3/155 307/52 |

FOREIGN PATENT DOCUMENTS

| | | |
|---|---|---|
| EP | 2017/079696 A1 | 1/2014 |
| WO | 03088373 A2 | 10/2003 |

OTHER PUBLICATIONS

Kim Jong-Seok, "High-Efficiency peak current control non-inverting buck boost converter using mode selection for single Ni-MH cell battery operation", Analog Integrated Circuits and Signal Processing, vol. 89, No. 2, Jul. 4, 2016, pp. 297-306, XP036067634.

T. Nabeshima; "A Novel Control Method of Boost and Buck-Boost Converters with a Hysteretic PWM Controller", EPE 2005, Dresden, 2005, pp. 1-6.

* cited by examiner

HYBRID ENERGY STORAGE SYSTEM

CROSS REFERENCE TO RELATED APPLICATIONS

The present application relates to and claims the priority of German patent application 10 2016 122 383.2, filed on 21 Nov. 2016, the disclosure of which is hereby expressly incorporated by reference into the subject matter of the present application in its entirety.

TECHNICAL FIELD

The disclosure relates to a hybrid energy storage system for exchanging energy using any desired combination of different energy storage units, according to the preamble of Claim 1.

BACKGROUND

Hybrid energy storage units are used in a multiplicity of applications, for example in automotive applications, in the industrial sector, in uninterruptible power supplies (UPSs), in medical technology (e.g. defibrillators) and for electrical tools. These applications are distinguished by the fact that different states occur, in which different levels of energy and/or quantities of energy are required. For example, when a drilling machine is started up large quantities of energy or a high level of current is required, whereas, as operation of the drilling machine continues, as soon as the drilling machine is "up and running", at rated load substantially smaller quantities of energy or levels of current are required for operation. Moreover, dynamic mechanical loads cause currents to fluctuate widely. This applies similarly with electric drives that are used for example in electric vehicles, or vehicles with a hybrid drive system. However, since every energy storage unit has a so-called comfort zone in which the energy storage unit can be operated without being damaged, problems arise when the energy consumption varies or fluctuates. Operating the energy storage unit outside its comfort zone may result in damage to the energy storage unit or degradation and hence the gradual destruction of the energy storage unit, as a result of which among other things the cyclic stability of the energy storage unit deteriorates.

Hybrid energy storage systems comprising a plurality of energy storage units enable work to be divided up: whereas one energy storage unit constantly supplies energy for a continuous output in its comfort zone, the other energy storage unit undertakes to provide peak energy currents for brief periods so that each of the energy storage units can be operated in its comfort zone and so there is no damage to the energy storage units. In this way, the service life of the energy storage units and their cyclic stability can be improved.

DE 10 2012 013 413 A1 discloses an arrangement of electrochemical energy storage units that comprises a first electrochemical energy storage unit and a second electrochemical energy storage unit. The two energy storage units are connected to one another such that, by way of energy flows, the energy storage units can exchange energy with one another and with at least one external energy source and/or with at least one external energy sink. Further, a device for controlling the energy flows is provided such that damage or overloading of the first energy storage unit at the expense of damage to the second energy storage unit can be prevented or reduced. Although in this case damage to the one energy storage unit is reduced, it is only at the expense of damage to the other energy storage unit.

US 2011/0084648 A1 discloses a hybrid energy storage system and a method for operating a hybrid energy storage system. The hybrid energy storage system has an ultra-capacitor connected to a DC bus and an energy source connected to the DC bus via a switch. The ultra-capacitor and the current source are both connected to a DC voltage converter. The hybrid energy storage system operates in four modes. In a low-energy mode, the DC voltage converter supplies the required energy such that the ultra-capacitor is maintained at a higher voltage than the energy source. In a high-energy mode, the DC voltage converter is no longer able to supply the required energy, the voltage of the ultra-capacitor cannot be maintained, and the energy source is connected to the DC bus by way of the switch. In a peak energy mode, the ultra-capacitor is used to increase the energy from the energy source. In a controlled charging mode, energy generated by the application is used to charge the ultra-capacitor.

A potential converter device having a first storage capacitor, a second storage capacitor and a converter device is disclosed in DE 10 2008 021 875 A1. The first storage capacitor is supplied with energy by an energy source. The converter device makes it possible to transfer energy from the first to the second storage capacitor if the potential curve of the first capacitor reaches a first threshold value and until the potential curve of the second capacitor reaches a second threshold value which is greater than the first threshold value. Further, the first capacitor is charged with the aid of the energy source over a period such that, during this period, energy for a connected consumer can be drawn off from the second capacitor.

The publication "T. Nabeshima; T. Sato; K. Nishijima; S. Yoshida: A Novel Control Method of Boost and Buck-Boost Converters with a Hysteretic PWM Controller, in EPE 2005, Dresden, 2005, pages 1-6", discloses a method for a buck-boost converter using a hysteretic pulse width modulation controller. Using an RC circuit connected to an auxiliary winding of the inductor, a triangular voltage is generated, and this is superimposed on the output voltage of the buck-boost converter and supplied to a hysteretic comparator as a feedback signal. In this way no steady-state error voltage is produced at the output, and variations in the input voltage and the load current are compensated.

US 2009/0317696 A1 discloses a battery device having a lithium battery and a lead acid battery. A control circuit has a voltage detection device and a voltage boost converter device. The voltage in the lead acid battery is detected automatically and used as a reference point. Then, the voltage in the lithium battery is increased to the reference point, that is to the voltage of the lead acid battery. In this disclosure, although damage to the lead acid battery is reduced by the support of the lithium battery, this is achieved at the expense of the lithium battery.

WO 03/088373 A2 discloses a hybrid battery arrangement having a high-power device and a high-energy battery, wherein, with the aid of a microprocessor and depending on the current required by the load, the high-power device and/or the high-energy battery is/are connected up to the load via a switch. As the switch there is disclosed a field-effect transistor. Using a DC voltage converter, the high-energy battery is able to recharge the high-power device during a switch-off period. However, because of the way it is manufactured, a field-effect transistor has the property of conductivity in two directions, with the result that a boost procedure is not possible, since with every switching procedure the boosted voltage drains again as a result of current flowing back from the higher potential to the lower.

SUMMARY

Taking this prior art as a starting point, the present disclosure prevents or reduces damage, premature ageing/degradation and/or overloading of an energy storage unit as a result of high energy flows, and enables the possibility of application-specific regeneration.

This is achieved using a hybrid energy storage system according to the features of Claim 1, and a method for controlling at least one electrophysical energy flow having the features of independent Claim 10. Advantageous further developments form the subject matter of the dependent claims. The features set forth individually in the claims are combinable with one another in technologically meaningful ways and can be supplemented by explanations of the situation in the description by details from the Figures, wherein further variants of embodiments of the disclosure are indicated.

This application concerns itself with levels of energy, energy flows and energy storage units. These terms are used to mean levels of electrophysical energy that may be produced for example by voltages and currents. However, capacitive and/or inductive energy is also possible. Further, the energy storage units are energy storage units that operate electrophysically and/or electrochemically.

In this document, the term "positive feedback phenomena" is understood to mean high-frequency switching operations that can result in destruction of the decoupling circuit 20, such as destruction of the OR-MOSFET used for this purpose.

The hybrid energy storage system has at least two energy storage units, a first electrophysically operating energy storage unit and a second electrophysically operating energy storage unit, each with a nominal energy flow. With the aid of at least one control circuit and in at least one direction, the energy storage units exchange electrical energy with one another and/or with at least one external energy source and/or external energy sink, by means of electrophysical energy flows. The control circuit has at least one boost converter having at least one electronic switch, and/or at least one buck converter that provides an energy flow from the first energy storage unit to the energy sink in the event that the energy sink requires a higher energy flow than the nominal energy flow from the second energy storage unit. The second energy storage unit supplies an energy flow of zero or a constant energy flow corresponding at most to the nominal energy flow of the second energy storage unit. Advantageously for preventing or reducing damage and/or overload in an energy storage unit as a result of high energy flows, the control circuit has at least one decoupling circuit for the purpose of suppressing positive feedback phenomena in the electronic switch and/or for the purpose of blocking reversed energy flows through the electronic switch from the first to the second energy storage unit.

The terms "first energy storage unit" and "second energy storage unit" have been selected at random and do not represent any restriction. Typically, there is designated as the first energy storage unit for example a battery to which a second energy storage unit, for example a capacitor, e.g. a double layer capacitor, is then connected up. Other configurations and sequences are likewise possible, however.

In order to enhance efficiency and to protect from thermal overload, the switch has at least one transistor, for example a MOSFET or another type of field-effect transistor (GaN, SiC), e.g. in the form of an OR-MOS implementation.

Advantageously for the handling of voltages and/or currents of large energy sinks that are larger than those of the second energy storage unit, the first energy storage unit has at least the same nominal voltage and/or at least the same nominal current as the second energy storage unit, e.g. twice the nominal voltage and/or twice the nominal current.

For preferably rapid blocking of the reversed energy flows, the decoupling circuit has at least one digital and/or one analogue decoupling circuit.

Advantageously for suppressing positive feedback phenomena in the switch and for blocking the reversed energy flows, the decoupling circuit has at least one of the following elements: at least one limiter, at least one proportional element, at least one integrating element and/or at least one comparator.

The proportional element preferably has at least one resistor that limits the current to the comparator in order to safeguard the functioning of the comparator.

In order advantageously to suppress positive feedback phenomena in the switch, the integrating element has at least one capacitor.

For the purpose of enhancing the operational reliability of the power electronics, the decoupling circuit preferably has at least one AND gate for the purpose of switching off the switch when the boost converter is switched off.

The control circuit has at least one measured value detector for the purpose of detecting measured values of the energy storage units, the energy source and/or the energy sink, as a result of which closed-loop control of currents and voltages is advantageously made possible.

The advantage is moreover achieved by providing a method for controlling at least one electrophysical energy flow having the features of claim 10. In order to prevent or reduce damage to the circuit and/or overload in an energy storage unit as a result of high energy flows, positive feedback phenomena in the switch are suppressed and/or energy flows that flow through the switch from the first to the second energy storage unit are suppressed.

Advantageously, there is used as the decoupling circuit a transistor, for example a MOSFET or another type of field-effect transistor (GaN, SiC), e.g. in the form of an OR-MOS implementation. The MOSFET is preferably used to enhance efficiency and to provide protection from thermal overload. Here, in the event of current flowing forwards, the internal parasitic diode which is always present is assistively bridged by the MOSFET, and in the event of blocking only the parasitic diode thereof is operational.

Further advantages are apparent from the subclaims and the description given below of a preferred exemplary embodiment. The features set forth individually in the claims are combinable with one another in technologically meaningful ways and can be supplemented by explanations of the situation in the description and by details from the Figures, wherein further variants of embodiments of the disclosure are indicated.

BRIEF DESCRIPTION OF THE FIGURES

The disclosure is explained in more detail below with reference to an exemplary embodiment illustrated in the attached Figures, in which.

DETAILED DESCRIPTION OF THE FIGURES

The disclosure is now explained in more detail by way of example, with reference to the attached drawings. However, the exemplary embodiments are only examples, which are not intended to restrict the inventive concept to a particular arrangement.

Before the disclosure is described in detail it should be pointed out that it is not restricted to the respective constituent parts of the device and the respective method steps, since these constituent parts and method may vary. The terms used here are merely intended to describe particular embodiments and are not used restrictively. Moreover, where the singular or the indefinite article is used in the description or the claims, this also refers to a plurality of these elements unless the overall context unambiguously indicates otherwise.

In this application, the terms "levels of energy", "energy flows" and "energy storage units" are used. These are used to mean levels of electrophysical energy produced for example by voltages and currents. However, capacitive and/or inductive energy is also possible. Further, the energy storage units are energy storage units that operate electrophysically and/or electrochemically.

Figure 1:
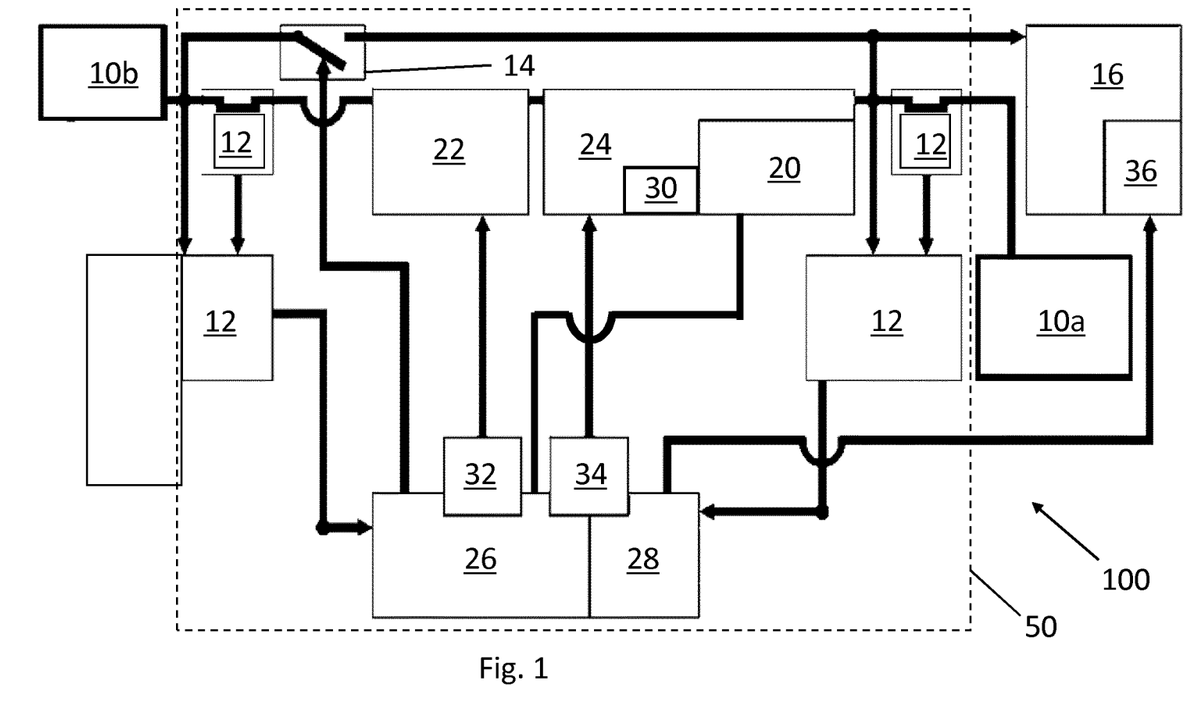
FIG. 1 shows a block circuit diagram of a hybrid energy storage system having two energy storage units, an energy sink and a control circuit having the decoupling circuit according to the disclosure.

FIG. 1 shows a block circuit diagram of a hybrid energy storage system 100 that has two energy storage units 10a, 10b, namely a first energy storage unit 10a and a second energy storage unit 10b each having a nominal energy flow, and has an energy sink 16 and a control circuit 50. In principle, more than two energy storage units may also be provided. With the aid of the control circuit 50 and in at least one direction, the energy storage units can exchange electrical energy with one another by means of electrophysical/electrochemical energy flows and can exchange electrical energy with an external energy sink 16 that is configured to be provided by the energy storage units. In the event that the energy sink 16 requires a higher energy flow than the nominal energy flow of the second energy storage unit 10b, which takes the form for example of a battery, the required energy is made available, with the aid of at least one boost converter 24, which has at least one electronic switch 30, and/or at least one buck converter 22, by for example the first energy storage unit 10a, which takes the form for example of a capacitor, e.g. taking the form of a double layer capacitor. So that the first energy storage unit 10a cannot be further discharged, a bridging switch 14, which has for example semiconductor elements, makes a direct energy connection between the first energy storage unit 10a and the second energy storage unit 10b. Besides a battery and a capacitor, any other configuration of an energy storage unit that operates electrophysically and/or electrochemically is also conceivable.

Consequently, the second energy storage unit 10b supplies an energy flow of zero or a constant energy flow corresponding at most to the nominal energy flow of the second energy storage unit 10b. For example, using the constant energy flow from the second energy storage unit 10b, it is possible to recharge the first energy storage unit 10a. For the purpose of providing closed-loop control of energy management between the two energy storage units 10a, 10b, the control circuit 50 has at least one microcontroller 26, at least one digital/analogue converter 28, which actuates a control switch 36 of the external energy sink 16, and a respective pulse width modulator 32, 34 for the buck converter 22 and boost converter 24. In the event of a continuous high load, the first energy storage unit 10a is discharged, with the energy level sinking until it reaches the same energy level as that currently prevailing in the second energy storage unit 10b. In order to suppress positive feedback phenomena in the electronic switch 30 and/or to block reversed energy flows through the electronic switch 30 from the first energy storage unit 10a to the second energy storage unit 10b, the control circuit 50 has at least one decoupling circuit 20.

A conventional boost converter has a diode that blocks in the direction of the output side. In order to enhance efficiency and to provide protection against thermal overload, instead of the diode a transistor is used as the switch 30, taking the form of a MOSFET or another type of field-effect transistor (GaN, SiC), e.g. in the form of an OR-MOS implementation. In the event of current flowing forwards the internal parasitic diode of this, which for manufacturing reasons is always present, is intended to be assistively bridged by the switch 30. In the event of blocking, however, only the parasitic diode thereof is to be operational.

Figure 4:
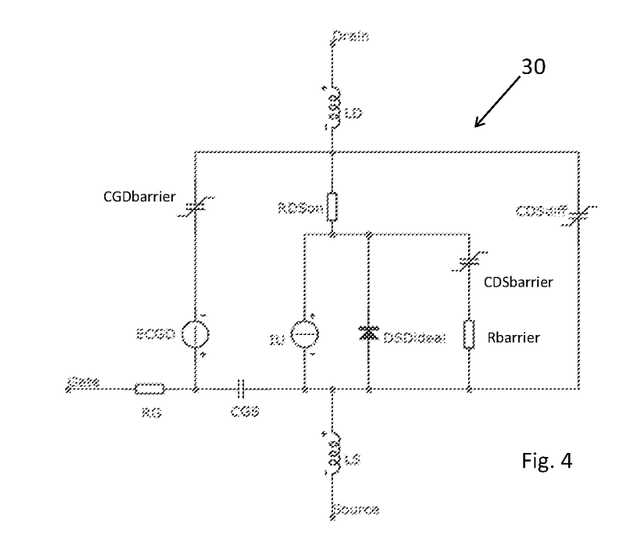
FIG. 4 shows an equivalent circuit of a MOSFET as the switch.

However, using the switch 30, that is to say the transistor, such as a MOSFET, has the disadvantage that—unlike a diode—it is conductive in two directions. That is to say that for the boost procedure a corresponding decoupling circuit 20 is required, since with every switching procedure the boosted voltage drains again immediately as a result of current flowing back from the higher potential in the first energy storage unit 10a to the lower potential in the second energy storage unit 10b. Here, in some cases the positive feedback phenomena of the electronic switch 30 have also to be taken into account, a point that is discussed below in more detail in conjunction with FIG. 4.

There are no restrictions on the energy storage units. It is possible to combine the properties of any at least two energy storage units 10a, 10b as desired. For example, an energy storage unit of low impedance is combinable with an energy storage unit of higher impedance. For example, it would be conceivable to use as the first energy storage unit 10a and the second energy storage unit 10b respective batteries of different impedance levels. Likewise conceivable, however, is the use of at least one capacitor, e.g. a double layer capacitor, as an energy storage unit, for example as the first energy storage unit 10a.

In a preferred exemplary embodiment, the electronic switch 30 takes the form of a transistor, for example a MOS or other type of field-effect transistor (GaN, SiC), e.g. in an OR-MOS implementation.

Preferably, the first energy storage unit 10a has at least the same nominal energy level, for example the same nominal voltage and/or the same nominal current, as the second energy storage unit 10b. Preferably, the decoupling circuit 20 has at least one digital decoupling circuit and/or analogue decoupling circuit, according to FIG. 2.

Figure 2:
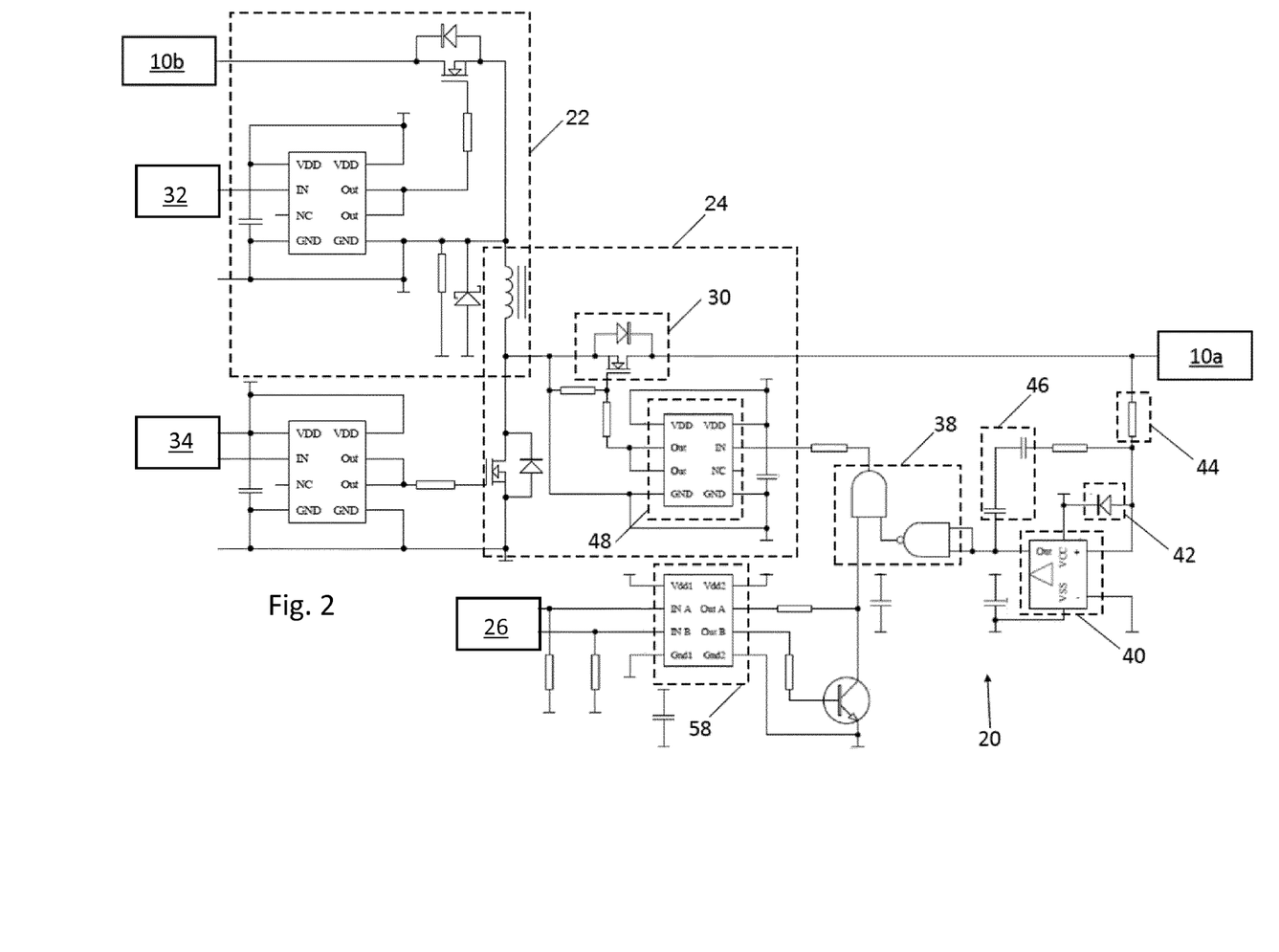
FIG. 2 shows a detail of the electrical circuit diagram of the control circuit from FIG. 1.

FIG. 2 shows a detail of the hybrid energy storage system 100 as an electronic circuit diagram. In a further preferred exemplary embodiment, the analogue decoupling circuit 20 has at least one of the following elements: at least one limiter 42, at least one proportional element 44, at least one integrating element 46 and/or at least one comparator 40.

The proportional element 44 preferably takes the form of a resistor that limits the current to the comparator 40. Other current limiters are in principle also conceivable. Preferably, the integrating element 46 has at least one capacitor that suppresses positive feedback phenomena in the switch 30.

For the purpose of switching off the switch 30 when the boost converter 24 is switched off, the decoupling circuit 20 preferably has at least one AND gate 38, for example as a result of a logical "0" at the AND gate 38.

For the purpose of providing closed-loop control of energy flows, for example currents and/or voltages, measured values of the energy storage units 10a, 10b and/or the energy source and/or energy sink 16 must be detected. For this reason, in a further preferred exemplary embodiment, the control circuit 50 has at least one measured value detector 12 (FIG. 3), which has been omitted from FIG. 2 for the sake of clarity.

Figure 3:
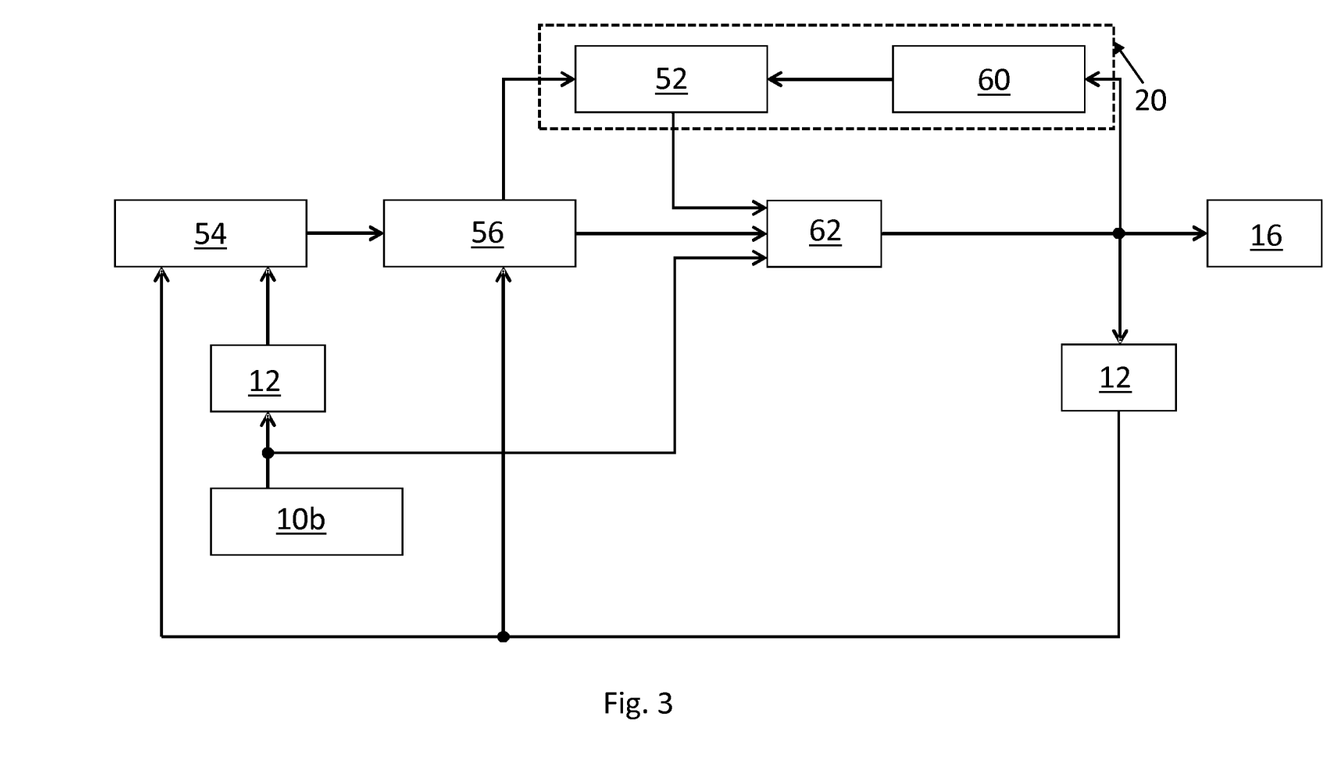
FIG. 3 shows a schematic representation of a detail of the hybrid energy storage system.

In a further preferred exemplary embodiment, FIG. 3 shows in schematic form a detail of the hybrid energy storage system 100 with a closed-loop control device 56 that has at least one boost converter 24 and at least one buck converter 22. The measured value detector 12 detects measured values, for example voltage and/or current, of the energy sink 16 and the energy storage units 10a, 10b. The measured values determine the respective operating mode of the hybrid energy storage system 100, for example buck converter or boost converter mode, and reference variables for a charge management arrangement 54 that has at least one microcontroller 26. The reference variables are for example the current and voltage of the external energy sink 16, and are parameterisable as desired with the aid of the charge management arrangement 54, and serve to operate the at least two energy storage units 10a, 10b within their comfort zone. If for example a previously defined current is exceeded, the energy storage unit 10a, which takes the form for example of a low-impedance double layer capacitor, serves as a source for current and voltage. Once the voltage of the discharging low-impedance energy storage unit 10a has reached the voltage value of the other energy storage unit 10b, for example a battery, there are two operating states. If current is to continue to flow, the energy storage unit 10b is connected to the energy sink 16, e.g. a load, by an actuator 62 that has at least one switch 30. If current is no longer to flow, the interruption in operation is used to recharge the energy storage unit 10a.

The actuator 62 operates with the aid of different input signals. These are: the output signal of the closed-loop control device 56; a signal, for example the voltage of the energy storage unit 10b, that switches the actuator 62 from buck converter operation to boost converter operation and vice versa; a blocking signal of a blocking signal transmitter 52 of a current direction discriminator 60 for preventing reversed energy flow, wherein the decoupling circuit 20 includes at least the blocking signal transmitter 52 and the current direction discriminator 60. The current direction discriminator 60 includes at least one threshold switch with at least one hysteresis function and/or at least one at least first-order transfer function, e.g. $f(s)=K/(Ts+1)$, where s is the Laplace operator, K is a static transfer factor and T is a time constant.

In this exemplary embodiment, the energy storage unit 10b takes the form for example of a battery and typically has a higher impedance than the energy storage unit 10a, which takes the form for example of a capacitor, e.g. a double layer capacitor. Also conceivable, however, are two energy storage units 10a, 10b, e.g. two batteries, one battery of high impedance and one battery of lower impedance. Instead of a battery of relatively low impedance, a capacitor, e.g. a double layer capacitor, is also conceivable.

In principle, the current direction discriminator 60 may also take a digital form, for example in the closed-loop control device 56. It would be conceivable to block the reversed current for example by way of a measuring arrangement that measures the rate at which the current rises using a defined current threshold value or a voltage threshold value between the boost converter 24 and the buck converter 22, using extremely rapid analogue/digital converters, wherein this measuring arrangement is either integrated into the microcontroller 26 or connected externally, as an integrated circuit. The analogue/digital converters process the signals from the measured value detector 12, which likewise have a dynamic and a measuring rate of a few nanoseconds.

For the purpose of controlling at least one electrophysical energy flow between the at least two energy storage units, which comprise a first energy storage unit 10a and a second energy storage unit 10b each having a nominal energy flow and/or at least one external energy source and/or at least one external energy sink 16, there is provided at least one control circuit 50 having at least one boost converter 24, which has at least one electronic switch 30, and/or buck converter 22. In the event that an energy flow greater than the nominal energy flow of the second energy storage unit 10b is required, the energy sink 16 is provided with an energy flow from the first energy storage unit 10a, while the second energy storage unit 10b supplies an energy flow of zero or a constant energy flow corresponding at most to the nominal energy flow of the second energy storage unit 10b. Positive feedback phenomena in the electronic switch 30 and/or reversed energy flows from the first energy storage unit 10a to the second energy storage unit 10b through the electronic switch 30 are suppressed.

Positive feedback phenomena are primarily high-frequency switching procedures that can result in destruction of the decoupling circuit 20, such as destruction of the transistor that is used by way of example for this purpose, such as an OR-MOSFET. As the switch 30, a transistor such as a MOSFET or "OR-MOS" is not the ideal component, and like any other component has parasitic properties. Using a model description of a MOSFET as the switch 30 in FIG. 4, the primary reason for this is found to be, depending on the switching procedure, the junction capacitance of the parasitic diode (DSDideal) or the differential drain source capacitance (CDSdiff) of the transistor. With the freewheeling current of the boost converter inductance, this capacitance sets up a resonance. At the start of the on-state phase, the barrier layer slowly drains, and in the blocking phase it builds up. This procedure does not take place abruptly, particularly with small on-state currents. The parasitic resistance RDSon of the switch 30, which in the conducting direction is parallel to the parasitic capacitance, causes a drop in voltage that in turn affects the decoupling circuit 20. That is to say that, in addition to the direct current through the switch 30, there is a superimposed AC portion from the above-mentioned source of resonance. Since the superimposed negative half-waves of the resonance amplitude (with a small DC portion) of the decoupling circuit 20 and hence the control circuit 50 specify an apparently back-flowing current, and the positive half-waves of the resonance amplitude specify an additional forward-flowing current, the control logic begins to actuate the switch 30 at the resonant frequency (usually in the MHz range). These high-frequency switching procedures, called positive feedback phenomena in this document, result in destruction of the OR-MOS and are thus inhibited or decoupled by the integrating element 46. In combination, this results in the possibility of very rapid switchover between the energy storage units 10a, 10b without positive feedback phenomena.

As the charge currents in the energy storage unit 10a fall, the switch-on time with PWM in the switch 30 grows shorter, until it falls below the frequency of the decoupling circuit 20. From this point on, the decoupling circuit no longer allows any currents to pass through the switch 30 and into the energy storage unit 10a, and then only the internal parasitic diode of the switch 30 is operational. In order nonetheless to prevent any unnecessary switching procedures of the decoupling circuit from occurring and to improve efficiency in this case, it is possible to disengage the decoupling circuit using the microcontroller 26 by way of the isolated data coupler 58.

It goes without saying that this description may be subject to the most diverse modifications, changes and adaptations which are within the range of equivalents to the attached claims.

The invention claimed is:

1. A hybrid energy storage system, including:
   at least two energy storage units, comprising a first energy storage unit and a second energy storage unit, each with a nominal energy flow,
   at least one boost converter comprising at least one electronic switch,
   at least one buck converter,
   at least one control circuit, by means of which the at least two energy storage units exchange electrical energy with one another and with at least one external energy sink by means of electrophysical energy flows in at least one direction,
   wherein, by means of the at least one boost converter and by means of the at least one buck converter, the control circuit comprising a microcontroller provides an energy flow from the first energy storage unit to the at least one external energy sink in the event that the at least one external energy sink requires a higher energy flow than the nominal energy flow from the second energy storage unit, while the second energy storage unit supplies an energy flow of zero or a constant energy flow corresponding at most to the nominal energy flow of the second energy storage unit,
   wherein the at least one control circuit comprises at least one decoupling circuit for suppressing positive feedback phenomena in the electronic switch and for blocking reversed energy flows through the at least one electronic switch from the first energy storage unit to the second energy storage unit, wherein the at least one electronic switch comprises at least one MOSFET transistor,
   wherein the at least one decoupling circuit comprises at least one limiter, at least one comparator and at least one AND gate, wherein the at least one AND gate is adapted and provided for switching off the at least one electronic switch when the boost converter is switched off,
   wherein the microcontroller is connected to the at least one decoupling circuit via a data coupler isolating different potentials of the at least two energy storage units to disengage the at least one decoupling circuit.

2. A hybrid energy storage system according to claim 1, wherein the first energy storage unit comprises at least the same nominal voltage as the second energy storage unit.

3. A hybrid energy storage system according to claim 1, wherein the first energy storage unit comprises at least the same nominal current as the second energy storage unit.

4. A hybrid energy storage system according to claim 1, wherein the at least one decoupling circuit comprises a digital decoupling circuit or an analogue decoupling circuit.

5. A hybrid energy storage system according to claim 4, wherein the analogue decoupling circuit comprises at least one of at least one proportional element and at least one integrating element.

6. A hybrid energy storage system according to claim 5, wherein the at least one proportional element comprises at least one resistor that limits the current to the comparator.

7. A hybrid energy storage system according to claim 5, wherein the at least one integrating element comprises at least one capacitor that suppresses positive feedback phenomena in the switch.

8. A hybrid energy storage system according to claim 1, wherein the at least one control circuit comprises at least one measured value detector adapted for detecting measured values of at least one of the elements including the at least two energy storage units, the at least one energy source, the at least one external energy sink.

9. A hybrid energy storage system according to claim 1, wherein the at least one limiter, the at least one comparator and the at least one AND gate are connected in series in the at least one decoupling circuit.

10. A hybrid energy storage system according to claim 4, wherein the at least one proportional element is connected in series upstream of the at least one limiter.

11. A hybrid energy storage system according to claim 1, wherein the at least two energy storage units exchange electrical energy with at least one external energy source by means of said electrophysical energy flows in the at least one direction.

12. A method for controlling at least one electrophysical energy flow in at least one direction between at least two energy storage units, comprising a first energy storage unit and a second energy storage unit, each with a nominal energy flow, and at least one external energy sink, comprising at least one control circuit having a microcontroller and at least one boost converter comprising at least one electronic switch, and at least one buck converter,
   wherein, in the event that the at least one external energy sink requires a higher energy flow than the nominal energy flow from the second energy storage unit, the at least one energy sink is provided with an energy flow from the first energy storage unit, while the second energy storage unit supplies an energy flow of zero or a constant energy flow corresponding at most to the nominal energy flow of the second energy storage unit,
   wherein a MOSFET transistor is used as the at least one electronic switch, wherein positive feedback phenomena of the MOSFET transistor are suppressed,
   wherein reversed energy flows through the MOSFET transistor from the first to the second energy storage unit are suppressed,
   wherein a decoupling circuit comprising at least one limiter, at least one comparator and at least one AND gate is used, wherein the at least one AND gate switches off the electronic switch when the at least one boost converter is switched off,
   wherein the microcontroller is connected to the at least one decoupling circuit via a data coupler isolating different potentials of the at least two energy storage units to disengage the decoupling circuit.

13. A method for controlling at least one electrophysical energy flow in at least one direction between at least two energy storage units, comprising a first energy storage unit and a second energy storage unit, each with a nominal energy flow, and at least one external energy sink and at least one external energy source, comprising at least one control circuit having a microcontroller and at least one boost converter comprising at least one electronic switch, and at least one buck converter, wherein, in the event that the at least one external energy sink requires a higher energy flow than the nominal energy flow from the second energy storage unit, the at least one energy sink is provided with an energy flow from the first energy storage unit, while the second energy storage unit supplies an energy flow of zero or a constant energy flow corresponding at most to the nominal energy flow of the second energy storage unit, wherein a MOSFET transistor is used as the at least one electronic switch, wherein positive feedback phenomena of the MOSFET transistor are suppressed, wherein reversed energy flows through the MOSFET transistor from the first to the second energy storage unit are suppressed, wherein a decoupling circuit comprising at least one limiter, at least one comparator and at least one AND gate is used, wherein the at least one AND gate switches off the electronic switch when the at least one boost converter is switched off, wherein the microcontroller is connected to the at least one decoupling circuit via a data coupler isolating different potentials of the at least two energy storage units to disengage the decoupling circuit.

* * * * *